(12) United States Patent
Okawa et al.

(10) Patent No.: US 6,340,132 B1
(45) Date of Patent: Jan. 22, 2002

(54) ELECTRONIC COMPONENT FEEDING DEVICE

(75) Inventors: Koji Okawa; Takao Kashiwazaki; Shuichi Kubota; Tadashi Endo; Masato Tanino, all of Yamanashi; Akira Kabeshita, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/452,524

(22) Filed: Dec. 1, 1999

(30) Foreign Application Priority Data

Dec. 25, 1998 (JP) .............................. 10-371621

(51) Int. Cl.[7] .............................................. B65H 23/00
(52) U.S. Cl. ...................... 242/566; 242/538.2; 226/139
(58) Field of Search .............................. 242/566, 535.5, 242/564.4, 564.1, 396.6, 550, 554.5, 538, 538.1, 615.2, 422.4, 591, 598.4, 598.5, 399, 399.2; 226/168, 128, 139, 190, 193, 21, 22, 23

(56) References Cited

U.S. PATENT DOCUMENTS

| 4,440,355 A | * | 4/1984 | Mori et al. |
| 4,687,152 A | * | 8/1987 | Hawkswell |
| 4,952,113 A | * | 8/1990 | Fujioka |
| 5,299,902 A | * | 4/1994 | Fujiwara et al. |
| 5,588,614 A | * | 12/1996 | Takada et al. |
| 5,725,140 A | * | 3/1998 | Weber et al. |
| 6,098,910 A | * | 8/2000 | Slezak |

* cited by examiner

*Primary Examiner*—William A. Rivera
(74) *Attorney, Agent, or Firm*—Jordan and Hamburg LLP (57) ABSTRACT

In an electronic component feeding device which comprises a component carrier tape wound around a reel, on which electronic components are accommodated in cavities formed on a support tape whose surface is covered by a removable top tape, a reel guide is pivotally mounted, which has a U-shaped cross section that resembles a hook, an open end of the hooked part being formed at a fixed angle θ, and which holds the reel when engaged with an outer peripheral edge of the reel.

13 Claims, 8 Drawing Sheets

ELECTRONIC COMPONENT FEEDING DEVICE

BACKGROUND OF THE INVENTION

The present invention relates to an electronic component feeding device that uses a component carrier tape in which chip-type electronic components are accommodated, and more particularly to an electronic component feeding device that feeds electronic components held in place on a carrier tape, while a top tape that covers the carrier tape is peeled away.

Figure 7:
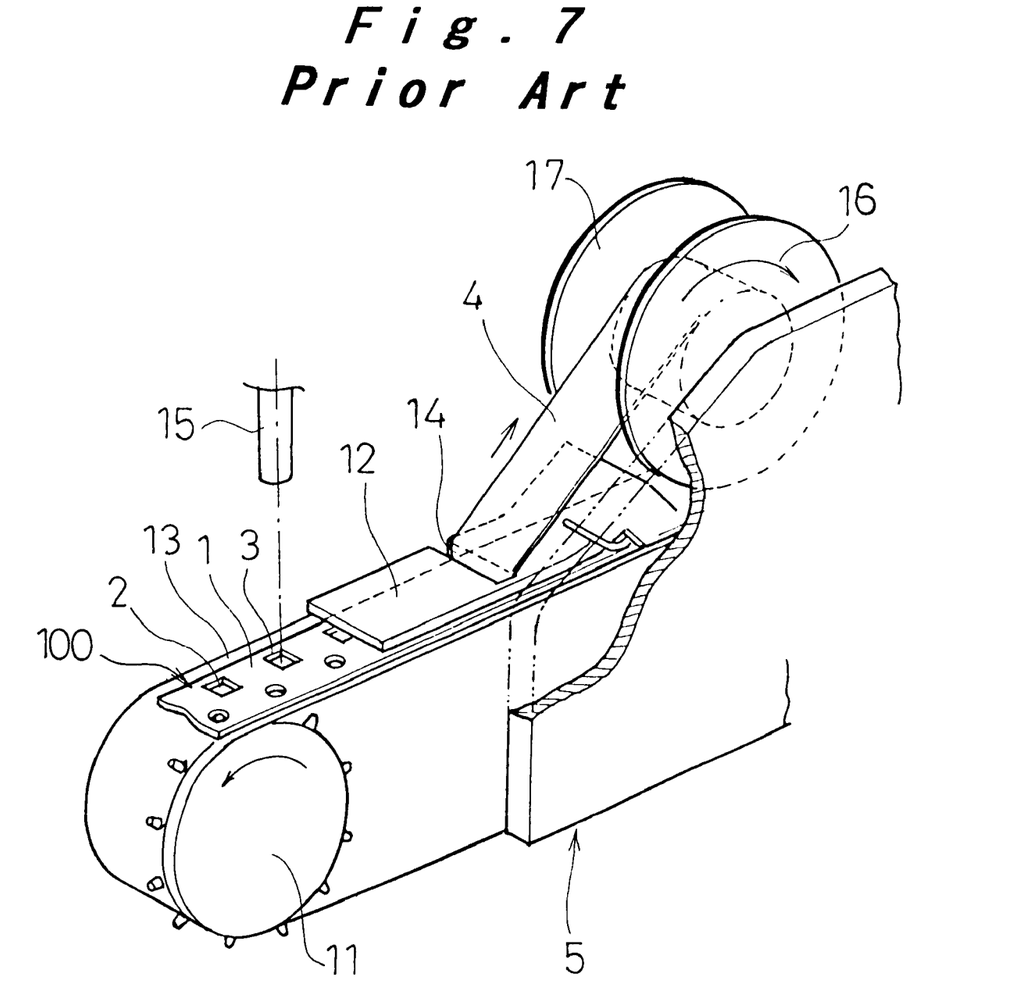
FIG. 7 shows a perspective view of a general configuration of a pertinent portion of a conventional electronic component feeding device.

A conventional tape-type electronic component feeding device is described with reference to FIGS. 7 through 9. FIG. 7 shows a component carrier tape 100 which comprises a support tape 1 provided with cavities 2 for accommodating electronic components 3 therein. The support tape 1 is covered by a removable top tape 4 for preventing the electronic components 3 from jumping out of the cavities 2.

Figure 8:
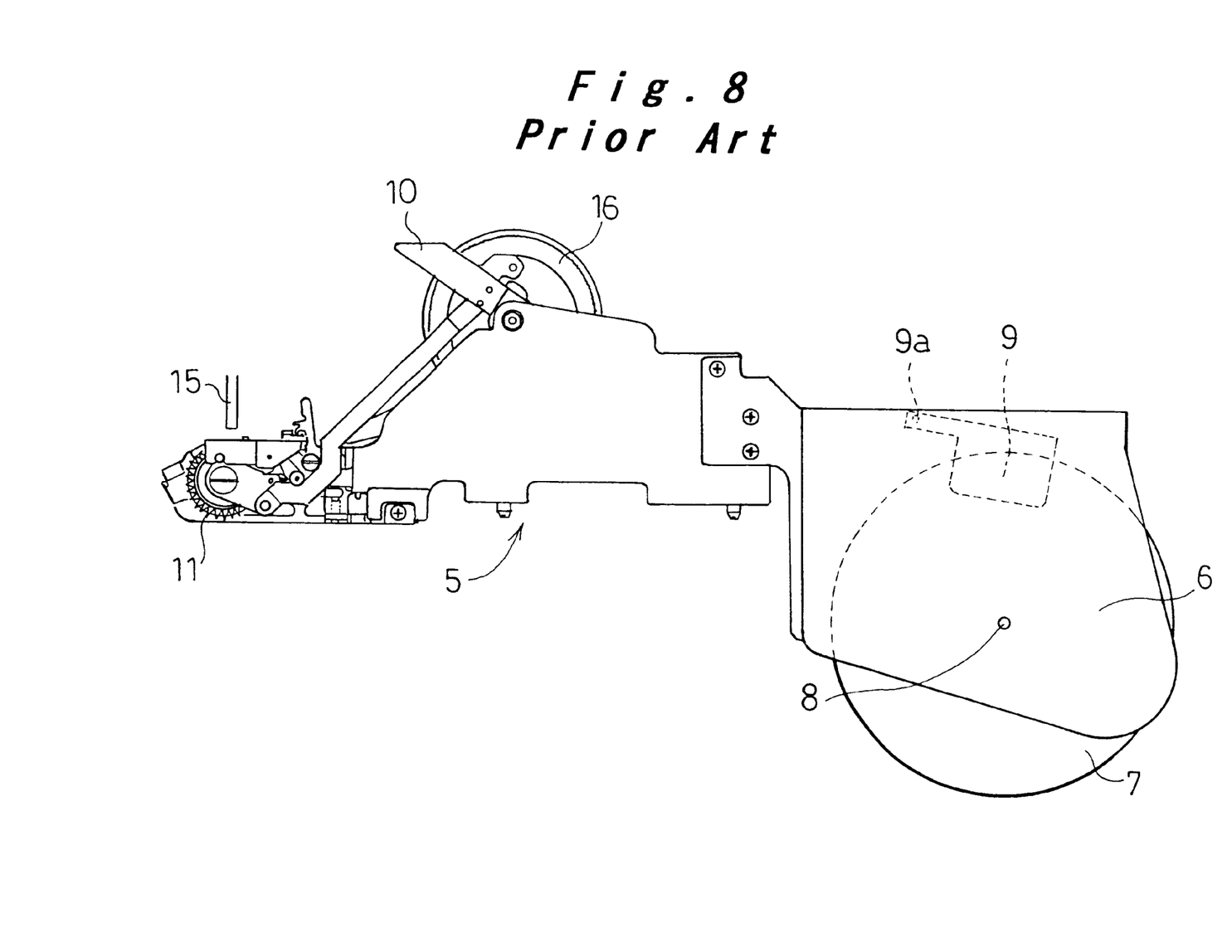
FIG. 8 shows a front view of an overall configuration of the conventional electronic component feeding device.
Figure 9A:
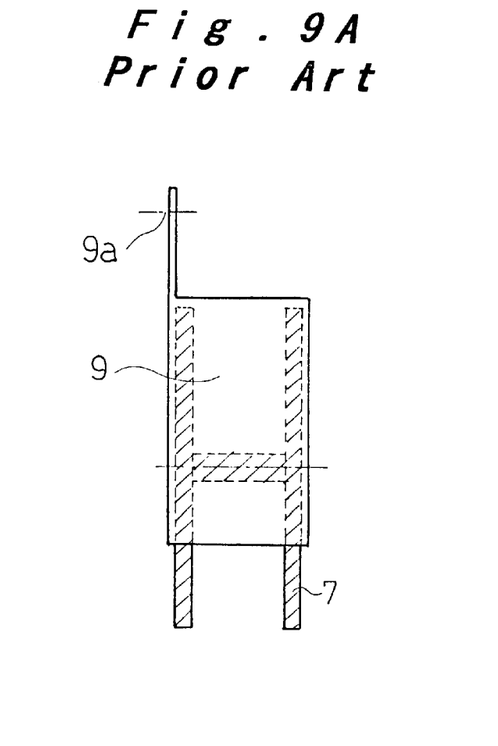
FIG. 9A is a plan view and FIG. 9B is a cross-sectional view showing a reel and a reel guide of the above conventional electronic component feeding device.
Figure 9B:
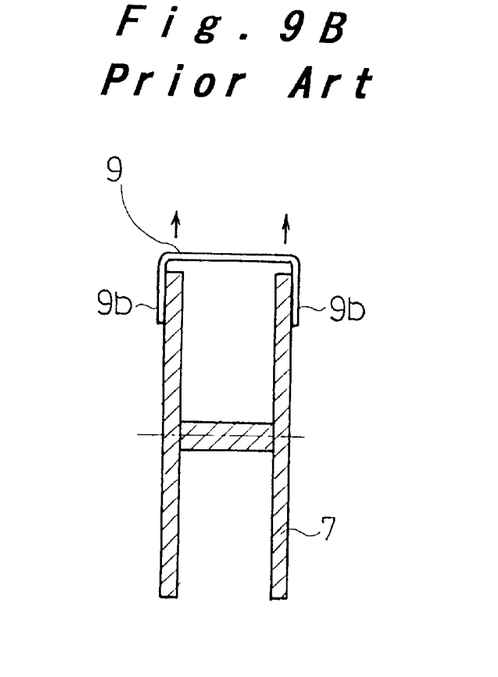

As shown in FIGS. 7 and 8, the component carrier tape 100 is wound around a reel 7 that is fitted to a reel holder 6 provided at a proximal end of the electronic component feeding device 5. A reel support pin 8, provided in the reel holder 6, is passed through a hole in the center of the reel 7, and a reel guide 9, that is pivotally mounted at one end 9a, is engaged with an outer peripheral edge of the reel 7, whereby the reel 7 is held in position. As is shown in FIG. 9B, the reel guide 9 has a U-shaped cross section and is mounted across the width direction of the outer edges of the reel 7 such that both side pieces 9b are engaged with the outer surfaces of the outer peripheral of the reel 7.

The component carrier tape 100 is drawn out from the reel 7 and fed out by a tape feed wheel 11, that is rotatably operated via upward and downward motion of a feed lever 10 on the electronic component feeding device 5. The component carrier tape 100 is advanced at a distal end of the electronic component feeding device 5 such that it is pressed against a tape conveying surface 13 by a tape holder 12. As the component carrier tape is fed at a specified pitch by the tape feed wheel 11, the top tape 4 is peeled off via a slit 14 provided in the tape holder 12, and the electronic components 3 are removed by a suction nozzle 15 at a predetermined location.

The top tape 4 thus removed is wound onto a take-up cap 17 that is disposed downstream of the tape holder 12 in the advancing direction of the component carrier tape 100. The take-up cap 17 is mounted on a ratchet mechanism 16 that turns only in one direction through a reciprocating action of the feed lever 10.

In the above described conventional configuration, the reel guide 9 has a U-shaped cross-section of a fixed width and holds the reel 7 by being mounted across the width direction; it therefore cannot accommodate variations in the width of the reel 7. For example, if the width of the reel 7 is large, then the reel guide 9 will apply a large resistance to the rotation of the reel 7, which could result in an unstable delivery of the component carrier tape 100 from the reel 7. Further, as shown by the arrows in FIG. 9B, the difference in the width direction of the force working on the reel guide 9 creates a torsional moment, which makes it difficult to maintain reel guide 9 rigidity. Moreover, since the reel guide 9 cannot be used for various components of different dimensions respectively accommodated in tapes of different widths, a special reel guide 9 must be provided for each type of electronic component feeding device 5.

SUMMARY OF THE INVENTION

In view of the foregoing, it is an object of the present invention to provide an electronic component feeding device that can effect a stable feed of component carrier tapes of various sizes from reels of different dimensions.

An electronic component feeding device of the present invention comprises a reel guide which is pivotally mounted on a reel holder and which has a U-shaped, hook-like cross section. The reel guide is engaged with an outer peripheral edge of a reel thereby holding the reel. A distal end of the hooked part of the reel guide is formed such as to open outwardly at a fixed angle in relation to a wall of the reel. With the distal end of the hooked part of the reel guide formed such as to open outwardly at a fixed angle, reels of differing dimensions in the width direction can be stably held.

The reel guide can be made thin if it is constructed such as to engage with only one side wall of the reel. Moreover, a torsional force does not act on the reel guide as it does when the reel guide is engaged across the entire width of the reel, and therefore the rigidity can be increased. A common reel guide can thus be used for various reels of different dimensions.

The reel guide may be biased against the reel by means of a spring thereby holding the reel with a certain force. The reel guide with its hooked part formed at a fixed angle can thus stably hold reels of differing dimensions, as it engages closely with the outer edges of the reel without any gaps there between.

If a plurality of reel support points are provided to the reel holder so as to be selectively used in accordance with the reel size, the reel holding force of the reel guide can be kept constant, and reels of various dimensions can be accommodated in a common reel holder.

The reel holder may be made removable from the main body of the electronic component feeding device, whereby a common reel holder can be used in various electronic component feeding devices respectively accommodating different types of components of various different sizes and shapes.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

Preferred embodiments of the electronic component feeding device of the present invention will be hereinafter described with reference to the accompanying drawings.

A first embodiment of the present invention is described with reference to FIGS. 1 to 3. An overall configuration of the electronic component feeding device 5 is the same as that described with reference to FIGS. 7 and 8, and same or similar elements are given the same reference numerals and the description omitted so that only particular elements of the present embodiment are described.

Figure 1:
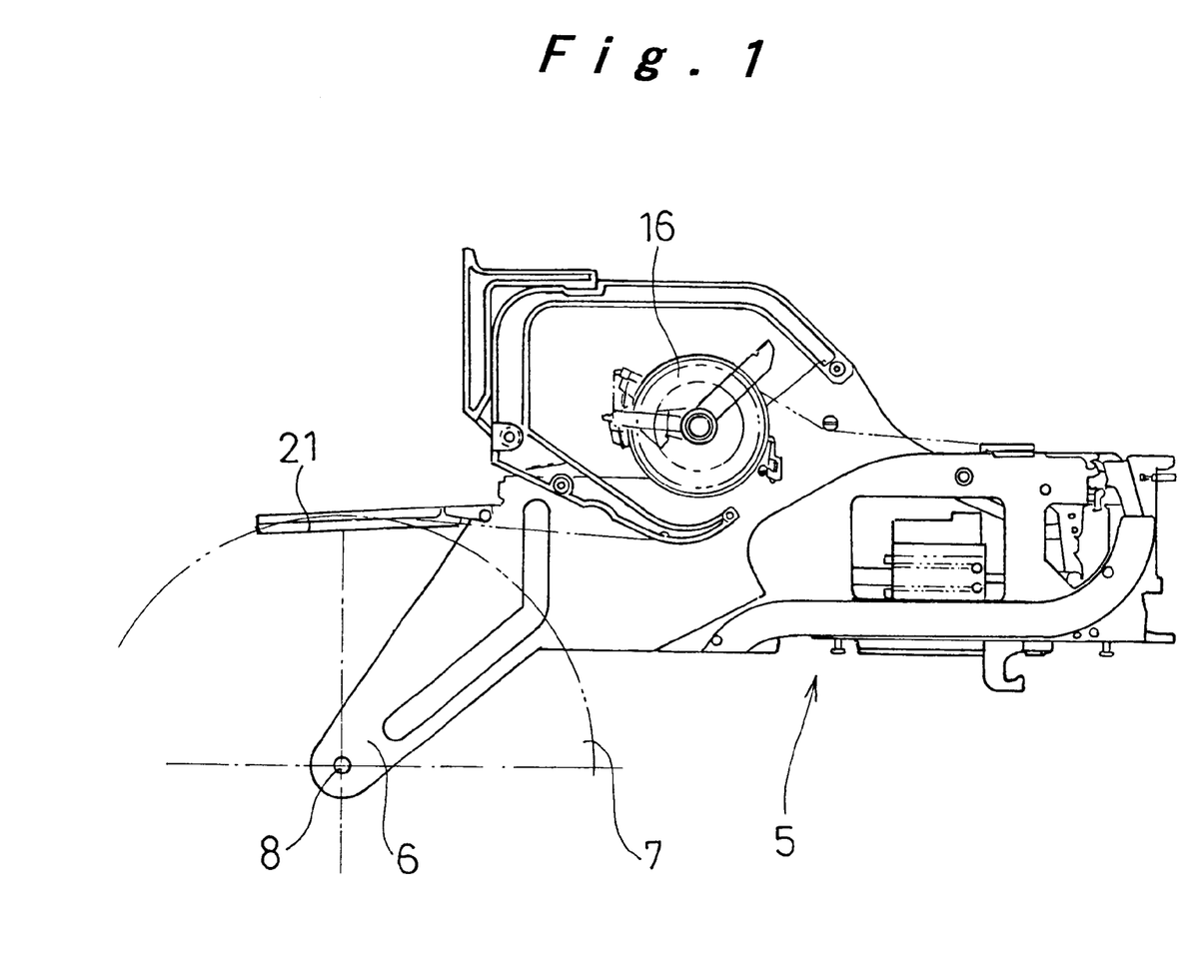
FIG. 1 is a front view of an overall configuration of a first embodiment of an electronic component feeding device of the present invention.

The overall configuration of the electronic component feeding device 5 is shown in FIG. 1. A reel holder 6 holds a reel 7 on which a component carrier tape is wound. A reel support pin 8 is provided to support the reel holder 6. As shown in FIG. 2, the reel 7 is provided with a hole in the center through which the reel support pin 8 is passed. A reel guide 21 is engaged with an outer peripheral edge of the reel 7 and thereby holds the reel 7.

Figure 2:
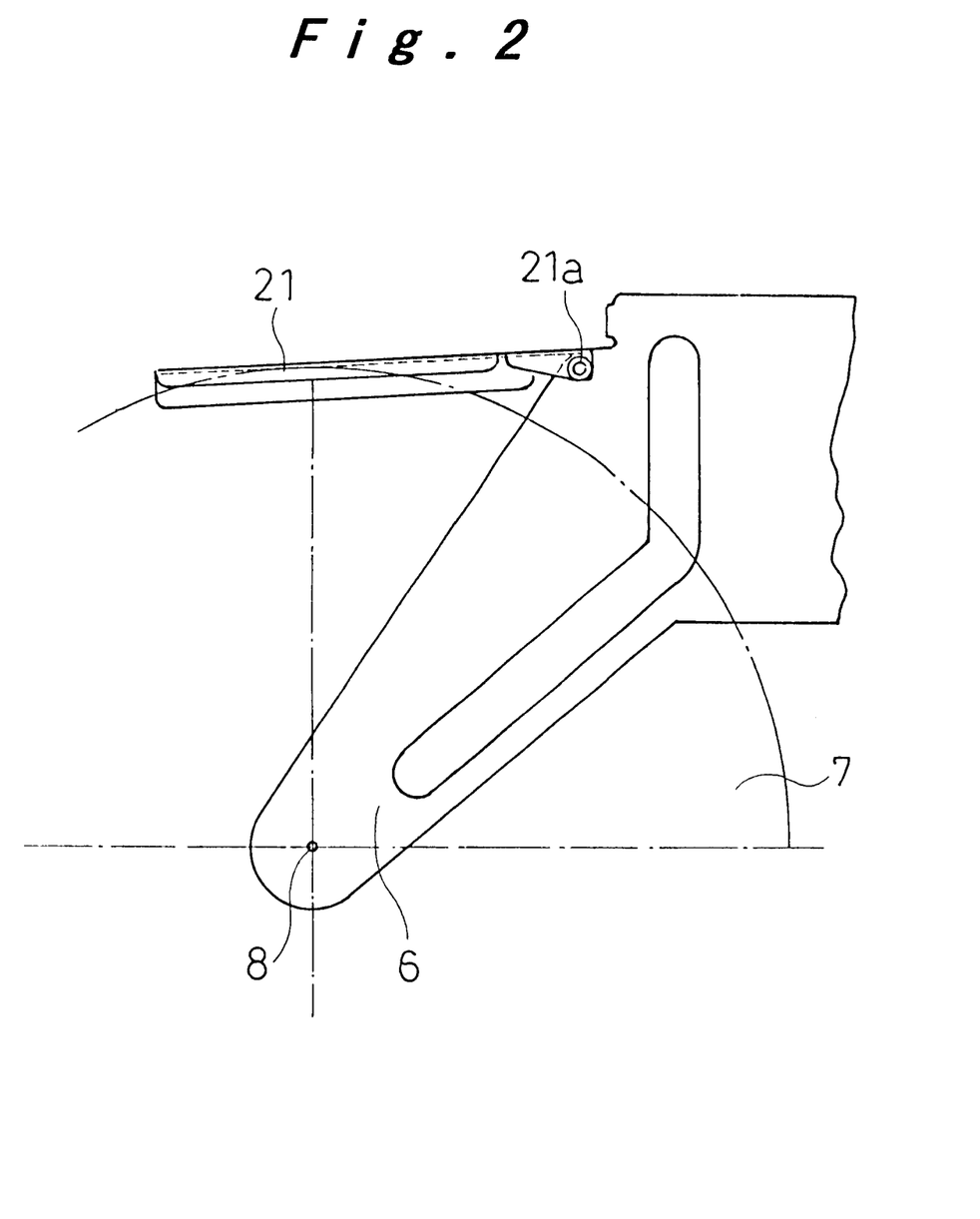
FIG. 2 is an enlarged front view of a reel holder of the above embodiment.
Figure 3A:
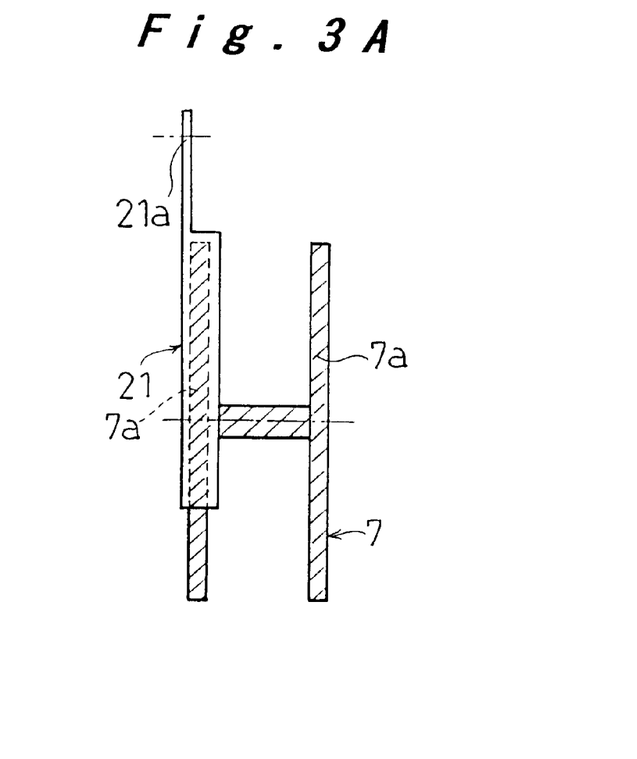
FIG. 3A is a plan view and FIG. 3B and FIG. 3C are cross-sectional views, showing a reel and a reel guide of the above embodiment.
Figure 3B:
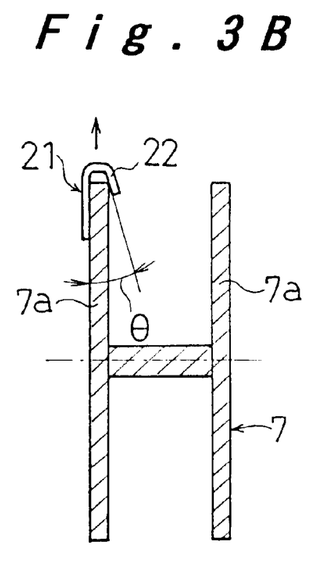

As shown in FIGS. 2, 3A, and 3B, the reel guide 21 is lever-shaped and one end 21a thereof is pivotally mounted on the reel holder 6 such that it can move upwards and downwards over a predetermined range. Its main portion has a U-shaped cross section that resembles a hook, an open end of the hooked part being set at a fixed angle θ; the open end of the hooked part 22 of the reel guide 21 holds the reel 7 when engaged with an outer peripheral edge of one of side plates 7a of the reel 7. The function of the hooked part 22 is evident if the open angle θ is greater than 0° and less than 90°, but it is preferable for the angle to be in the range of 10° to 45°.

Figure 3C:
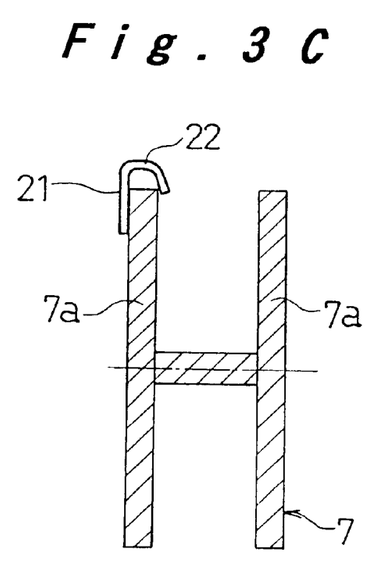

According to this embodiment of the present invention, the reel guide 21 is shaped so as to have a cross-sectional shape that is set at a fixed angle θ on its open side; therefore any variation in the width dimension of the side plates 7a, as shown in FIGS. 3B and 3C, is compensated for by the depth of contact with the hooked part 22 without applying large resistance. As a result, the reel 7 is stably held. In particular, the reel guide 21 of this embodiment is engaged with an outer peripheral edge of one side plate 7a of the reel 7, and therefore the reel guide 21 can be made thin enough so that the only force which acts on the support point of the reel guide 21 is the force around the support point within a plane including the support point. That is, no torsional force acts on the reel guide 21 in a direction orthogonal to the plane including the support point of the reel guide 21, wherefore the rigidity of the reel guide 21 can be increased. Thus a common reel guide can be used for reels 7 with various dimensions in the width direction.

In the above embodiment the reel guide 21 is configured so as to be engaged with the outer edge of one side plate 7a of the reel 7, but the width dimension of the reel guide 21 can be configured to match the width dimension of the reel 7 to enable contact with the outside of the outer edges of both side plates 7a, 7a of the reel 7.

FIG. 7 shows a second embodiment of the present invention. Descriptions of the same elements as those used in the first embodiment are omitted, with only the differences being described.

Figure 4:
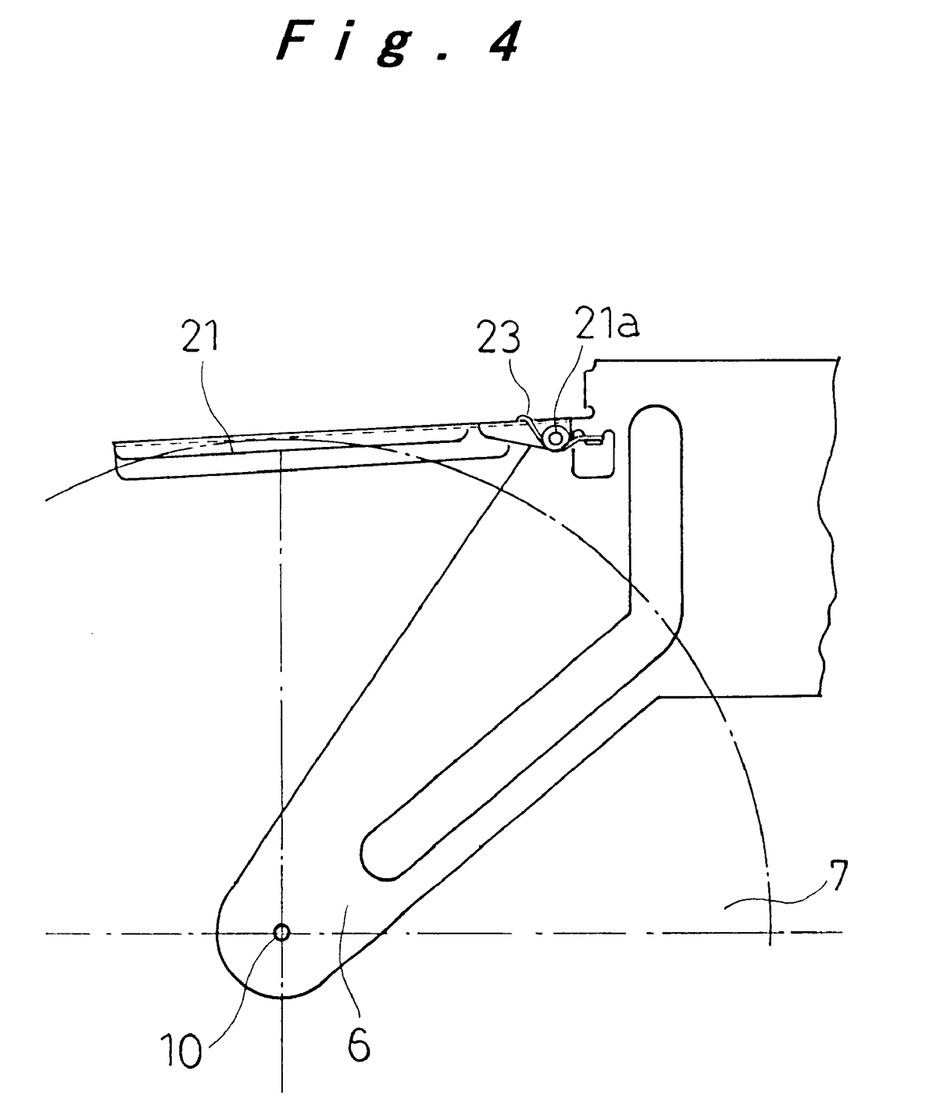
FIG. 4 shows an enlarged front view of a reel holder of a second embodiment of the present invention.

In this embodiment the reel guide 21 is configured so as to be pressed against a side of the reel 7 by a spring 23 with a force of 100 g to 200 g. A coil spring is preferred for use as the spring 23, but any spring besides a coil spring or any non-spring elastic body may also be used for the spring 23.

According to the present embodiment, the reel guide 21 is pressed against the reel 7 by the spring 23, enabling the reel guide to hold reels of differing dimensions stably by maintaining continuous contact with an outer edge of same without any gaps occurring there between.

Figure 5:
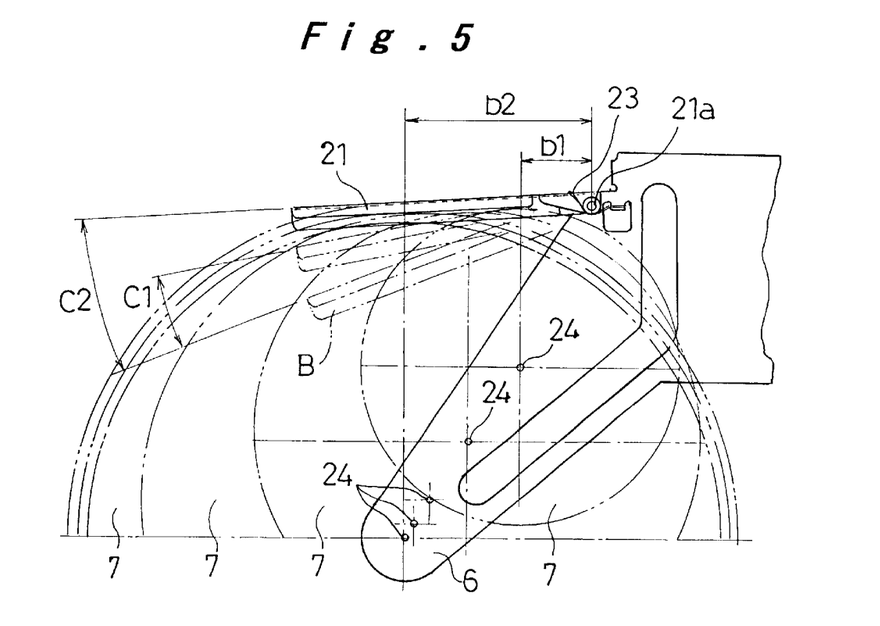
FIG. 5 shows an enlarged front view of a reel holder of a third embodiment of the present invention.

FIG. 5 shows a third embodiment of the present invention. Descriptions of the same elements as those used in the first and second embodiments are omitted, with only the differences being described.

In this embodiment the reel guide 21 is pressed against the reel 7 by the spring 23 and the reel holder 6 is provided with a plurality of holes 24 in which a reel support pin 8 is fitted, so that the reel support pin 8 can be held in place in the desired hole 24 by a screw (not shown) in accordance with the diameter of the reel 7.

According to the present embodiment, the holes 24 for holding the reel support pin 8 can be selected according to the reel diameter and thereby allow the reel guide 21 to press against the reel 7 with a fixed force. In other words, the force of pressure applied to the reel 7 by the reel guide 21 via the spring 23 changes depending on the angle attitude of the reel guide 21 and its point of contact with the reel 7. When the size of the reel 7 changes, therefore, the contact point between the reel guide 21 and the reel 7 changes over the range b1 to b2 and the angle at which the reel guide 21 is brought into contact with the reel 7 (the angle from position B on the reel guide 21 when a reel 7 is not installed) accordingly changes over the range c1 to c2, thereby keeping the pressure force constant.

The above function will be evident at a force of pressure in the range of 50 g to 500 g, but a range of 100 g to 200 g is preferable.

Figure 6:
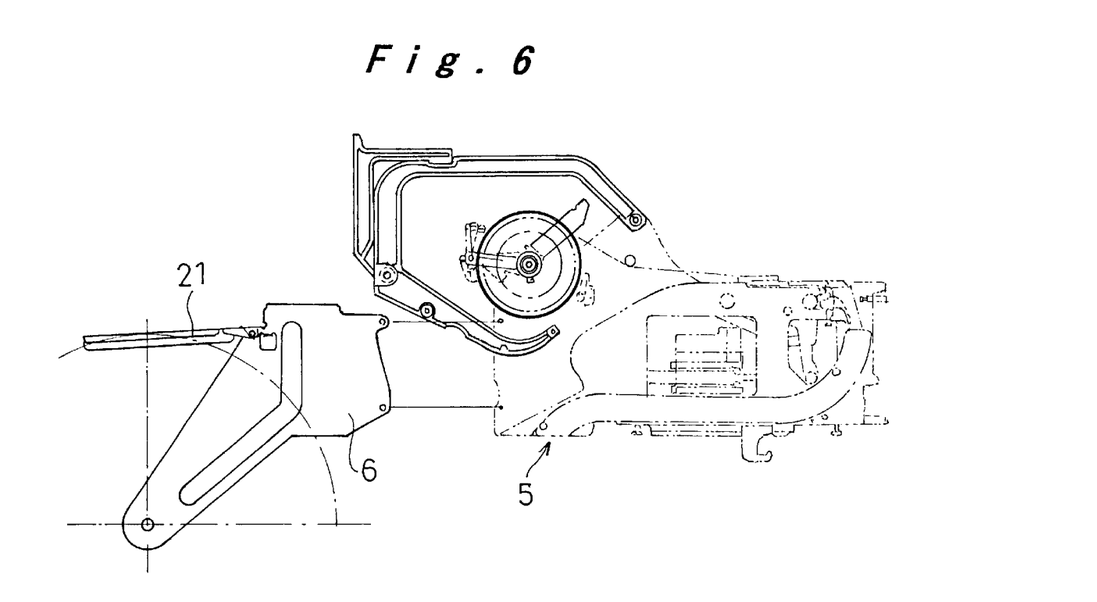
FIG. 6 shows an exploded front view of an overall configuration of a fourth embodiment of an electronic component feeding device of the present invention.

FIG. 6 shows a fourth embodiment of the present invention. Descriptions of the same elements as those used in the first through third embodiments are omitted, with only the differences being described.

In this embodiment the reel holder 6 is configured as an independent component that can be attached to and detached from the electronic component feeding device 5 and can be held in place by screws.

According to the present embodiment the reel holder 6 can even be attached to electronic component feeding devices 5 that use component carrier tapes of different shapes.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. An electronic component feeding device for feeding electronic components carried by a component carrier tape wound around a reel having an outer peripheral edge, the electronic component feeding device comprising:

a reel holder for accepting the reel;

a reel guide movably mounted on the reel holder to move into contact with the outer peripheral edge of the reel;

said reel guide defining a channel for engaging the outer peripheral edge of the reel thereby holding the reel; and said channel having channel walls opening outwardly at a fixed angle such that a width of said channel increases.

2. The electronic component feeding device according to claim 1 wherein the reel has side plates and the reel guide is engaged with the outer peripheral edge of only one of the side plates of said reel thereby holding the reel.

3. The electronic component feeding device according to claim 1 further comprising a bias device biasing said reel guide against said reel such that the reel is held at a fixed force.

4. The electronic component feeding device according to claim 3 wherein the reel holder has a plurality of support points for holding the reel disposed at positions such that reel holding force of said reel guide is kept constant despite the reel having different sizes by selecting one of the plurality of support points in accordance with a size of the reel.

5. The electronic component feeding device according to claim 3 wherein said bias device is a spring.

6. The electronic component feeding device according to claim 1 wherein said reel holder is detachably mountable on a main body of the electronic component feeding device.

7. The electronic component feeding device according to claim 1 wherein said reel guide is pivotally mounted on said reel holder.

8. The electronic component feeding device according to claim 1 wherein said channel has a cross section in the shape of a U.

9. An electronic component feeding device for use with a carrier tape for accommodating electronic components on a reel having two side plates, the electronic component feeding device comprising:

a reel holder supporting the reel; and a reel guide having one end pivotally connected to the reel holder and another end defining a channel engaged with one of the two side plates of the reel, said channel having a longer side and a shorter side defining an angle such that a width of the channel increases.

10. The electronic component feeding device according to claim 9 wherein said channel has a cross section in the shape of a U.

11. The electronic component feeding device according to claim 9 further comprising a bias device biasing said reel guide against said one of two side plates such that the reel is held at a fixed force.

12. The electronic component feeding device according to claim 11 wherein the reel holder has a plurality of support points for holding the reel disposed at positions such that reel holding force of said reel guide is kept constant despite the reel having different sizes by selecting one of the plurality of support points in accordance with a size of the reel.

13. The electronic component feeding device according to claim 9 wherein said reel holder is detachably mountable on a main body of the electronic component feeding device.

* * * * *